United States Patent
Hujsak et al.

(10) Patent No.: US 11,120,968 B2
(45) Date of Patent: Sep. 14, 2021

(54) HIGH SPEED/LOW DOSE MULTI-OBJECTIVE AUTONOMOUS SCANNING MATERIALS IMAGING

(71) Applicant: Northwestern University, Evanston, IL (US)

(72) Inventors: Karl A. Hujsak, Evanston, IL (US); Vinayak P. Dravid, Glenview, IL (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 16/758,326

(22) PCT Filed: Oct. 25, 2018

(86) PCT No.: PCT/US2018/057455
§ 371 (c)(1),
(2) Date: Apr. 22, 2020

(87) PCT Pub. No.: WO2019/221778
PCT Pub. Date: Nov. 21, 2019

(65) Prior Publication Data
US 2020/0321188 A1 Oct. 8, 2020

Related U.S. Application Data

(60) Provisional application No. 62/577,029, filed on Oct. 25, 2017.

(51) Int. Cl.
*H01J 37/28* (2006.01)
*G01N 23/2251* (2018.01)

(52) U.S. Cl.
CPC .......... *H01J 37/28* (2013.01); *G01N 23/2251* (2013.01); *G01N 2223/402* (2013.01); *H01J 2237/24485* (2013.01)

(58) Field of Classification Search
CPC .......... H01J 37/00; H01J 37/02; H01J 37/222; H01J 37/244; H01J 37/26; H01J 37/261; H01J 37/28; G01N 23/2251; G01N 23/2273
USPC ................................ 250/305, 306, 310, 311
See application file for complete search history.

(56) References Cited

U.S. PATENT DOCUMENTS

| | | |
|---|---|---|
| 2005/0123181 A1 | 6/2005 | Freund et al. |
| 2006/0127880 A1 | 6/2006 | Harris et al. |
| 2012/0257038 A1* | 10/2012 | Raicu .................... G02B 21/16 348/79 |

OTHER PUBLICATIONS

Zhang et al., Reduced Electron Exposure for Energy-Dispersive Spectroscopy Using Dynamic Sampling, Oct. 23, 2017, Ultramicroscopy, 184, pp. 90-97. (Year: 2017).*

Erni, R., et al., *Atomic-resolution imaging with a sub-50-pm electron probe*. Physical review letters, 2009. 102(9): p. 096101.

Kimoto, K., et al., *Element-selective imaging of atomic columns in a crystal using STEM and EELS*. Nature, 2007. 450(7168).

(Continued)

*Primary Examiner* — Jason L McCormack
(74) *Attorney, Agent, or Firm* — Bell & Manning LLC

(57) ABSTRACT

Aspects of the present disclosure involve applying a Multi-Objective Autonomous Dynamic Sampling algorithm in an electron or other radiation/charged-particle microscope for the characterization of elemental, chemical, and crystallographic information with over an order of magnitude improvement in time and exposure.

20 Claims, 11 Drawing Sheets

(56) References Cited

OTHER PUBLICATIONS

Chu, M.-W., et al., *Emergent chemical mapping at atomic-column resolution by energy-dispersive X-ray spectroscopy in an aberration-corrected electron microscope.* Physical review letters, 2010. 104(19): p. 196101.
Kelly, D., et al., *Energy Dispersive X-Ray Spectroscopy in Liquids: Inorganic and Biological Applications.* Microscopy and Microanalysis, 2016. 22(S5): p. 72-73.
Holtz, M.E., et al., *In situ electron energy-loss spectroscopy in liquids.* Microscopy and Microanalysis, 2013. 19(4): p. 1027-1035.
Wu, J., et al., *Imaging and elemental mapping of biological specimens with a dual-EDS dedicated scanning transmission electron microscope.* Ultramicroscopy, 2013. 128: p. 24-31.
Que, E.L., et al., *Zinc sparks induce physiochemical changes in the egg zona pellucida that prevent polyspermy.* Integrative Biology, 2017. 9(2): p. 135-144.
Muller, D.A., *Structure and bonding at the atomic scale by scanning transmission electron microscopy.* Nature materials, 2009. 8(4): p. 263-270.
Leapman, R. and R. Ornberg, *Quantitative electron energy loss spectroscopy in biology.* Ultramicroscopy, 1988. 24(2-3): p. 251-268.
Watanabe, M., et al., *Improvements in the X-ray analytical capabilities of a scanning transmission electron microscope by spherical-aberration correction.* Microscopy and Microanalysis, 2006.12(6): p. 515-526.
Hutchison, J.L., et al., *A versatile double aberration-corrected, energy filtered HREM/STEM for materials science.* Ultramicroscopy, 2005. 103(1): p. 7-15.
Egerton, R., P. Li, and M. Malac, *Radiation damage in the TEM and SEM.* Micron, 2004. 35(6): p. 399-409.
Egerton, R.F., *Electron energy-loss spectroscopy in tne electron microscope.* 2011 : Springer Science & Business Media.
Hitchcock, A.P., et al., *Comparison of NEXAFS microscopy and TEM-EELS for studies of soft matter.* Micron, 2008. 39(3): p. 311-319.
Bammes, B.E., et al., *Direct electron detection yields cryo-EM reconstructions at resolutions beyond 3/4 Nyquist frequency.* Journal of structural biology, 2012. 177(3): p. 589-601.
Ruskin, R.S., Z. Yu, and N. Grigorieff, *Quantitative characterization of electron detectors for transmission electron microscopy.* Journal of structural biology, 2013. 184(3): p. 385-393.
McDowell, M.T., et al., *Studying the kinetics of crystalline silicon nanoparticle lithiation with in situ transmission electron microscopy.* Advanced Materials, 2012. 24(45): p. 6034-6041.
Luo, L., et al., *Dynamics of electrochemical lithiation/delithiation of graphene-encapsulated silicon nanoparticles studied by in-situ TEM.* Scientific reports, 2014. 4.
Lustig, M., et al., *Compressed sensing MRI.* IEEE signal processing magazine, 2008. 25(2): p. 72-82.
Choi, K., et al., *Compressed sensing based cone-beam computed tomography reconstruction with a first-order method.* Medical physics, 2010. 37(9): p. 5113-5125.
Stevens, A., et al., *The potential for Bayesian compressive sensing to significantly reduce electron dose in high-resolution STEM images.* Microscopy, 2013. 63(1): p. 41-51.
Candes, E.J., J.K. Romberg, and T. Tao, *Stable signal recovery from incomplete and inaccurate measurements.* Communications on pure and applied mathematics, 2006. 59(8): p. 1207-1223.
Donoho, D.L., *Compressed sensing.* IEEE Transactions on information theory, 2006. 52(4): p. 1289-1306.
Candés, E.J., J. Romberg, and T. Tao, *Robust uncertainty principles: Exact signal reconstruction from highly incomplete frequency information.* IEEE Transactions on information theory, 2006. 52(2): p. 489-509.
Duarte, M.F., et al., *Single-pixel imaging via compressive sampling.* IEEE signal processing magazine, 2008. 25(2): p. 83-91.
Stevens, A., et al., *Applying compressive sensing to TEM video: a substantial frame rate increase on any camera.* Advanced Structural and Chemical Imaging, 2015. 1(1): p. 10.
Anderson, H.S., et al. *Sparse imaging for fast electron microscopy.* in *Computational Imaging.* 2013.
Kovarik, L., et al., *Implementing an accurate and rapid sparse sampling approach for low-dose atomic resolution STEM imaging.* Applied Physics Letters, 2016. 109(16): p. 164102.
Béché, A., et al., *Development of a fast electromagnetic beam blanker for compressed sensing in scanning transmission electron microscopy.* Applied Physics Letters, 2016. 108(9): p. 093103.
Hujsak, K., et al., *Suppressing Electron Exposure Artifacts: An Electron Scanning Paradigm with Bayesian Machine Learning.* Microscopy and Microanalysis, 2016. 22(4): p. 778-788.
Godaliyadda, G.D., G.T. Buzzard, and C.A. Bouman. *A model-based framework for fast dynamic image sampling.* In *Acoustics, Speech and Signal Processing (ICASSP), 2014 IEEE International Conference on.* 2014. IEEE.
Godaliyadda, G., et al., *A supervised learning approach for dynamic sampling.* Electronic Imaging, 2016. 2016(19): p. 1-8.
Banerjee, R., et al., *Phase evolution during crystallization of sputter-deposited amorphous titanium—aluminium alloy thin films: Dimensional and solute effects.* Philosophical Magazine A, 2000. 80(8): p. 1715-1727.
Scarborough, Nicole M., et al. "Dynamic X-ray diffraction sampling for protein crystal positioning." *Journal of synchrotron radiation* 24.1 (2017): 188-195.
The International Search Report and Written Opinion issued in International Patent Application No. PCT/US18/57455 dated Nov. 8, 2019, pp. 1-8.
Zhang et al., "Reduced Electron Exposure for Energy-Dispersive Spectroscopy using Dynamic Sampling," In: Cornell University Library/Computer Science/Machine Learning, Jun. 27, 2017, [online] [retrieved on Oct. 17, 2019 (Oct. 17, 2019)} Retrieved from the Internet ,URL: https://arxiv.org/abs/1707.03848., entire document, especially Abstract; pp. 4-13.

\* cited by examiner

HIGH SPEED/LOW DOSE MULTI-OBJECTIVE AUTONOMOUS SCANNING MATERIALS IMAGING

CROSS REFERENCE TO RELATED APPLICATIONS

This application is a National Stage of International Application No. PCT/US18/57455 filed Oct. 25, 2018, which claims the benefit of priority to U.S. Provisional Patent Application No. 62/577,029 filed Oct. 25, 2017, the disclosures of which are incorporated by reference herein in their entirety.

STATEMENT REGARDING FEDERALLY-SPONSORED RESEARCH

The present application/invention was made with government support under DGE1324585 awarded by the National Science Foundation and FA8650-15-2-5518 awarded by the Air Force Officer of Scientific Research. The government has certain rights in the invention.

TECHNICAL FIELD

Aspects of the present disclosure relate to microscopy and image processing, and in particular, the processing of image, volumetric, or spectral data generated via microscopy devices using machine-learning algorithms.

BACKGROUND

Linking microscopic properties to macroscale performance of a material or a device has been a key goal for a wide variety of fields, including Mechanical Engineering, Materials Science, Biomedical Engineering, Chemistry, and Quality Assurance. Common techniques used to image elemental and crystallographic structure include Electron Energy Loss Spectroscopy (EELS), Energy Dispersive X-ray Spectrometry (EDS), X-ray Fluorescence (XRF), and Scanning Nano-diffraction. More generally, these techniques involve the capture of rich data over a grid of pixels in which measurements are acquired serially and generally suffer from either very long collection times or induced sample damage over prolonged imaging.

It is with these problems in mind, among others, that various aspects of the present disclosure were conceived.

BRIEF DESCRIPTION OF THE DRAWINGS

The foregoing and other objects, features, and advantages of the present disclosure set forth herein will be apparent from the following description of particular embodiments of those inventive concepts, as illustrated in the accompanying drawings. Also, in the drawings the like reference characters refer to the same parts throughout the different views. The drawings depict only typical embodiments of the present disclosure and, therefore, are not to be considered limiting in scope.

SUMMARY

Figure 1:
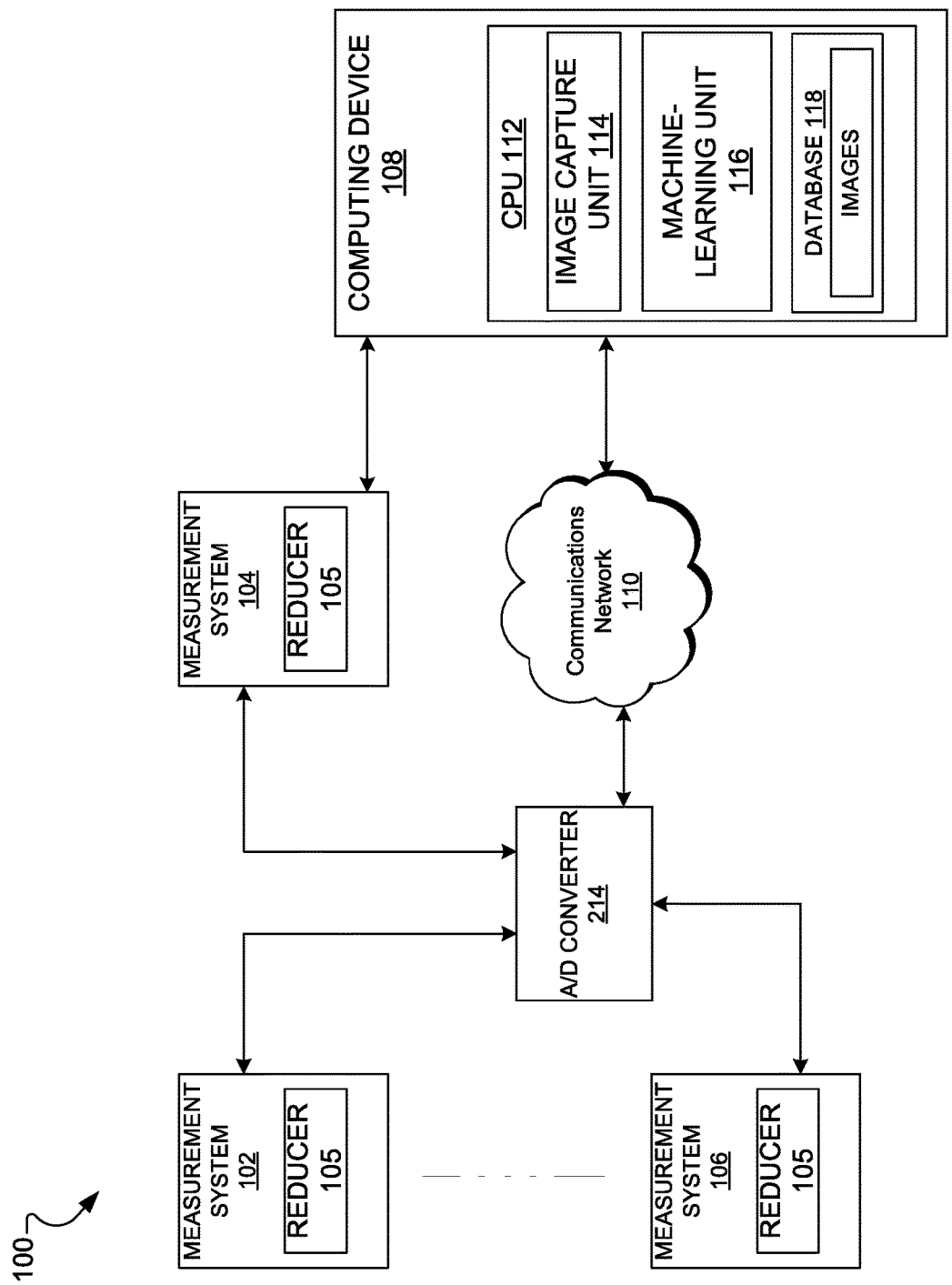
FIG. 1 is a block diagram illustrating a computing architecture for performing high speed/low dose Multi-Objective autonomous scanning and imaging, according to aspects of the present disclosure.

Many microscopy techniques, such as electron microscopy, operate by scanning a radiative probe to interact with a specimen/sample. A grid of pixels over a region of interest of the specimen/sample is defined and a signal from the radiative probe, or electron beam, is integrated into each pixel as it scans (e.g., raster scanned). During the scanning, every pixel is recorded to form an accurate picture of the sample/specimen. Thus, if the size of the rectangular grid, or region of interest, is increased by a fixed amount, the total number of measurements necessary to perform the scanning equates to the mathematical square of the increase. If the dwell time of the electron beam is kept constant, the result is often a large or high-resolution map requiring hours or days to fully record, a time range in which the specimen/sample or microscope is rarely stable. Thus, users are often forced to choose between high fidelity maps with low signal-to-noise ratio (SNR) or low fidelity maps with sufficient SNR.

The following sections will describe the specific application towards an electron microscope, but the concepts could also be generalized to any microscope or investigatory device which must make sequential observations on a dense grid. Technological advances in electron microscopy, particularly improvements in detectors and aberration correctors, have led to higher throughput and less invasive imaging of materials and biological structures by enhancing SNR ratios at lower electron exposures. Analytical methods, such as electron energy loss spectroscopy (EELS) and energy dispersive x-ray spectrometry (EDS) have also benefitted and now offer a bevy of elemental and bonding information with atomic resolution. However, spatially resolved spectrum imaging with EELS and EDS continue to be difficult to scale due to limited detector collection angles or high signal background, requiring hours or even days for full maps to be obtained.

Aspects of the present disclosure solve these specific technical problems, among others, by providing systems and methods that implement and automatically execute an intelligent sampling algorithm, referred to herein as "Multi-Objective Autonomous Dynamic Sampling" (MOADS), to reduce the time and dosing required to perform image mapping, such as spectrum mapping. In particular, the MOADS algorithm directs a microscope, such as a Scanning Transmission Electron Microscope ("STEM") to perform an initial coarse spectral sampling, from which an estimate of the true spectral image may be made. Based on the estimation, points with a large expected contribution (e.g., maximum contribution) to the information in the image are dynamically identified and collected. The system employs the MOADS algorithm to automatically analyze the elements present and calculate a new estimate of the spectral image and the relevant points of interest based on previous measurements. The process is continuous and executes until a pre-allotted dose, time threshold, or quality metric is met. By dynamically and adaptively selecting non-redundant measurements which contribute information, the algorithm autonomously converges on an accurate map with an order of magnitude reduction in time and dose.

The various examples and embodiments described herein may be applied generally to any type of STEM device(s). Alternatively, it is contemplated that the various concepts described herein may be applied to STEMs (e.g., designed and developed by all three of the major manufacturers including FEI, JEOL, Hitachi) that include a Digital Micrograph (DM©, Gatan Corp.) control interface. In such embodiments, the MOADS algorithm may be included or otherwise integrated as a 'plug-in' (or other type of software component) for the Digital Micrograph or arbitrary microscope/device control software.

DETAILED DESCRIPTION

Newer generations of electron microscopes (e.g., STEM devices) have dramatically increased spatial resolution and analytical sensitivity by focusing ever higher electron currents into smaller and smaller volumes. Studies of a wide variety of materials which utilize new high brightness and high coherence electron sources now commonly report atomic resolution imaging and atom-by-atom elemental mapping with Electron Energy Loss Spectroscopy (EELS) and Energy Dispersive X-ray Spectrometry (EDS). Commercially available MEMS-based sample holders, which can encapsulate the sample in a small volume of controllable fluid or gas, have also become widely available for most microscopes with accessible EDS or EELS signals. Spatially resolved EDS and EELS spectra, referred to as spectrum images (SI), have continued to be applied to the exploration of soft and hybrid soft/hard materials, often answering questions about complex and nanoscale processes un-addressable through other imaging modalities. In contrast to energy filtered TEM, these spectrum images provide 'fine structure' which can be used to resolve bonding configuration and/or other information about local electronic structure.

Although increased radiative fluency with a fixed cross section for signal generation has had advantages for EELS and EDS, the limited detector collection angles for EDS and high background signal in EELS have prevented the routine application of spectrum imaging at reasonable doses/times. In particular, the predilection of soft, hybrid, and in-situ systems to be damaged under incident radiation has been an unresolved problem that has been compounded by the increasing brightness of modern electron sources. Moreover, radiation damage with higher available beam currents and the longer acquisition times for improved pixel resolution and field of view further exasperate an already complex problem of dose-induced damage/changes to ultrastructure of materials. Improvements in detectors have somewhat mitigated these challenges, but remain an expensive investment with relatively slow-moving improvements. Larger area or higher fidelity spectrum images of dose insensitive materials also provide challenges, as the hours or days required to complete a full map may exceed the stability of the microscope or specimen. Such a scenario is especially true for in-situ systems, where dynamics often proceed at much faster rates. A need exists for improved methods of collecting spatially resolved EELS and EDS signals at area doses low enough for the preservation of sensitive structures, and/or for the acceleration of conventional spectrum images for the investigation of spatially confined biological-inorganic complex structures, engineered hybrid soft/hard ordered materials, or responsive and dynamic reconfigurable nanostructures.

Recently, a bevy of algorithmic approaches have been proposed to substantially reduce the collection time or radiative dose of electron, x-ray, and/or other radiation based probe instruments. The central idea of these methods is that there is a significant amount of redundancy in most experimental data, which can be disregarded without loss of fidelity. For example, sparse imaging involves an under-sampled acquisition of the signal in real space. The same signal properties of compressibility are then exploited to impute reasonable values for the missing entries in the image, which both reduces the area dose and the acquisition time. A considerable amount of redundancy means statistically accurate reconstructions from sparse acquisition can be achieved for sampling percentages low enough to reduce sample damage.

Instead of pre-choosing which measurements to make, the disclosed system performs dynamic and/or adaptive sampling. More specifically, dynamic sampling is performed 'on-the-fly' during the acquisition process; as pixels are sampled an estimate of the true sample image is continually computed and positions of maximal information are adaptively acquired. By sequentially and intelligently choosing measurements the system can automatically reconstruct an accurate approximation of the true image at far lower sampling rates than previous static under-sampling.

FIG. 1 illustrates an example computing architecture 100 comprising one or more measurement systems 102-106 and a computing device 108, all of which may be deployed with the computing architecture 100 to execute MOADS algorithm(s) that reduce the time and dosing required to perform image mapping of samples/specimens. The one or more measurement systems 102-106 and the computing device 108 may be functionally and communicatively connected via a communications network 110, which may be an IP-based telecommunications network, the Internet, an intranet, a local area network, a wireless local network, a content distribution network, or any other type of communications network, as well as combinations of networks. Alternatively, the one or more measurement systems 102-106 and the computing device 108 may be functionally and communicatively connected according to a local arrangement, in which such devices directly interact with one another, such as via a hardline or wireline.

Figure 2:
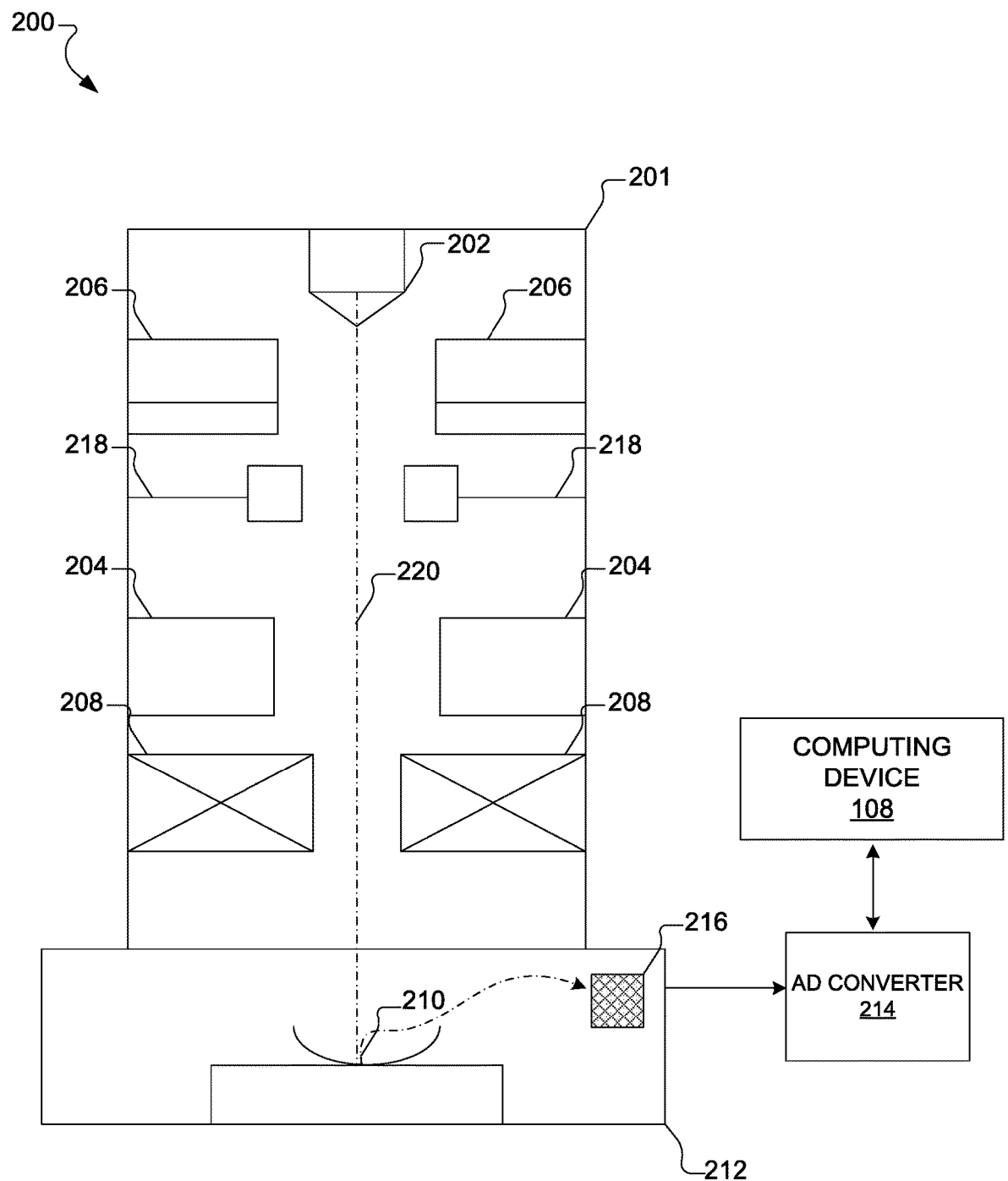
FIG. 2 is an illustration of a STEM, according to aspects of the present disclosure.

In one embodiment, each of the one or more measurement systems 102-106 may be a SEM, as illustrated in FIG. 2 at 200. Generally speaking, the SEM 200 represents a type of electron microscope that produces images of a sample specimen by scanning it with a focused beam of electrons.

The electrons interact with atoms in the sample specimen, producing various signals that may be detected and that contain information about the sample's surface topography and/or composition. In one specific example, the sample specimen may be scanned in a raster scan pattern, and the beam's position is combined with the detected signal to produce an image. In the illustrated embodiment, the SEM 200—enclosed within a vacuum chamber 201—includes an electron gun 202, a deflecting coil 204, a condenser lens 206 and an objective lens 208, which focuses a primary electron beam 220 emitted from the electron gun 202 and illuminates a sample specimen 210 with the beam. The sample specimen 210 is included within a sample chamber 212. In some embodiments, the SEM 200 may also include a A/D converter 214 that converts an image signal detected by a secondary electron detector 216 into a digital image signal, which in turn, may be transmitted to the computing device 108.

Figure 9:
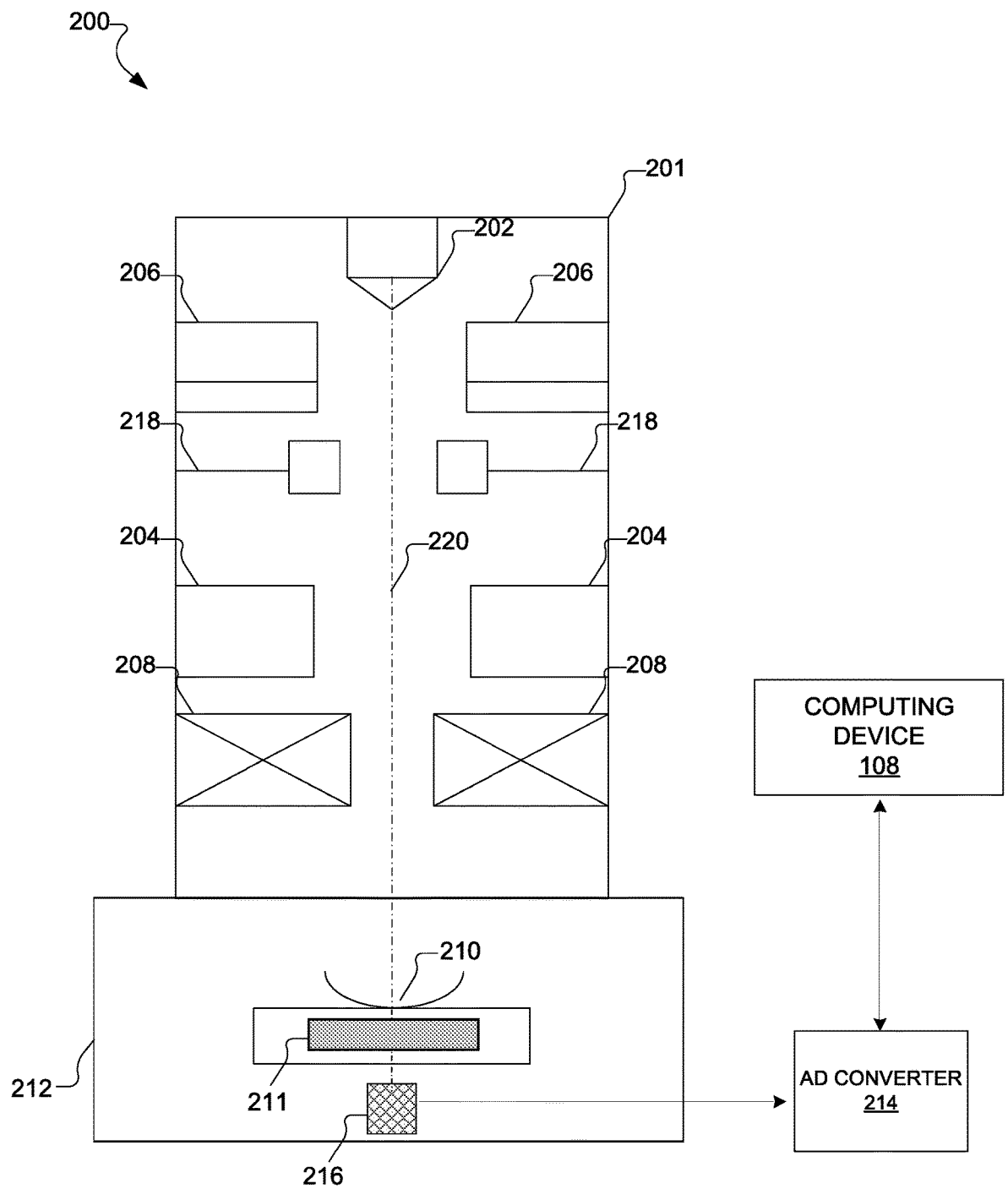
FIG. 9 is an illustration of a SEM, according to aspects of the present disclosure.

In another embodiment, each of the one or more measurement systems 102-106 may be a STEM, as illustrated in FIG. 9 at 200. In contrast to SEM, a STEM is equipped with a series of lenses and detectors to collect electrons that pass through the sample specimen. In this example illustration, the sample is a thin electron transparent film, from which STEM can provide an extremely high resolution structural and analytical picture. The post-specimen lenses 211 control the scattering angle which is collected by a series of annular detectors, allowing control over the bright field and dark field signals. The detectors may also be removed and replaced with a spectrometer which can record the energy distribution of the electrons passing through the specimen. Fitting different regions of this spectrum allows for elemental mapping from characteristic spectral fingerprints, referred to as Electron Energy Loss Spectroscopy (EELS).

Referring again to FIG. 1, a reducer 105 may be employed in each of the one or more measurement systems 102-106 to reduce the amount of energy provided by the one or more measurement systems 102-106 when generating images. Stated differently, the reducer 105 is a mechanism, component, device, and/or the like, that deflects the beam generated by the one or more measurement systems 102-106. In one embodiment and with reference to FIG. 2, the STEM 200 may operatively connect to, or otherwise include, a reducer system in the form of a high-speed electrostatic beam blanker 218. The high-speed beam blanker 218 is intended to blank/unblank a beam of electrons generated and/or otherwise provided by the STEM 200, according to an on/off control mechanism that is synchronized with the scanning of the electron beam from the electron gun 202.

In one embodiment, the beam blanker 218 may include a deflector formed by two electrodes and downstream of said deflector a diaphragm with an aperture. The diaphragm intercepts the beam of electrons when the beam is deflected by a deflector, and the aperture transmits the beam when the beam is not or hardly deflected. While the above example refers to a beam blanker, it is contemplated the reducer system may involve other types of devices and systems, such as a masking material and corresponding control system, a physical beam stopper, and/or the like. In one embodiment, the beam of electrons is directly moved to interact with just the pixels that contain information, thereby reducing both the overall time and the dose applied to the sample.

In another embodiment, the STEM 200 and the reducer system 105 may be a Quanta 600F scanning electron microscope with a Nanometer Pattern Generations Systems ("NPGS") beam control system (collectively referred to herein as the "Quanta Scanning Example"). The lithography system integrates two 16 bit digital-to-analog converters ("DAC") to control beam position, an analog-to-digital converter (ADC) to collect the imaging signal and a high-speed electrostatic beam blanker. The NPGS digital imaging feature may be modified to perform an "unfair coin toss" process to select the sampled pixels given a user selected percentage. The image may be acquired in a standard raster scan and the beam may be blanked at those pixel locations determined to be un-sampled. In this way, the raw 16 bit output from the ADC may be stored for 'on' pixels and a value of zero stored for 'off' pixels. The dwell time of the 'on' pixels, as well as the resolution and magnification of the image may be user selectable, or preset.

Referring again generally to FIG. 1, the computing system 106, to which the one or more measurement system 102-106 and the reducer 105 are connected, includes a CPU 112. The CPU 112 includes an image capturing unit 114 that captures incomplete and/or intentionally under-sampled images generated by the one or more measurement systems 102. The CPU 116 also includes a machine-learning unit 116 that executes various MOADS algorithms to reduce the time and dosing required to perform spectrum mapping, based on images captured by the image capturing unit 114. In some embodiments, the computing device 108 may include a database 118 for storing and retrieving mappings of images. Although the database 118 of FIG. 1 is depicted as being located within the computing device 108, it is contemplated that the database 118 may be located external to the computing device 108, such as at a remote location, and may communicate with the computing device 108 via the communications network 110. Additionally, although the machine-learning unit 116 is illustrated as being located within the computing device 108, it is contemplated that the machine learning unit 116 may be located directly within the one or more measurement systems 102-106 as a form of executable instructions defining the MOADS algorithm(s) (e.g., as a software plug-in).

Although the previous embodiments refers to electron microscopy and/or STEMs, it is contemplated that systems and methods described herein may be used in other fields, and further, may be applied to or otherwise used in conjunction with other types of measurement devices in which data and/or information (e.g., images) may be captured serially.

Figure 3:
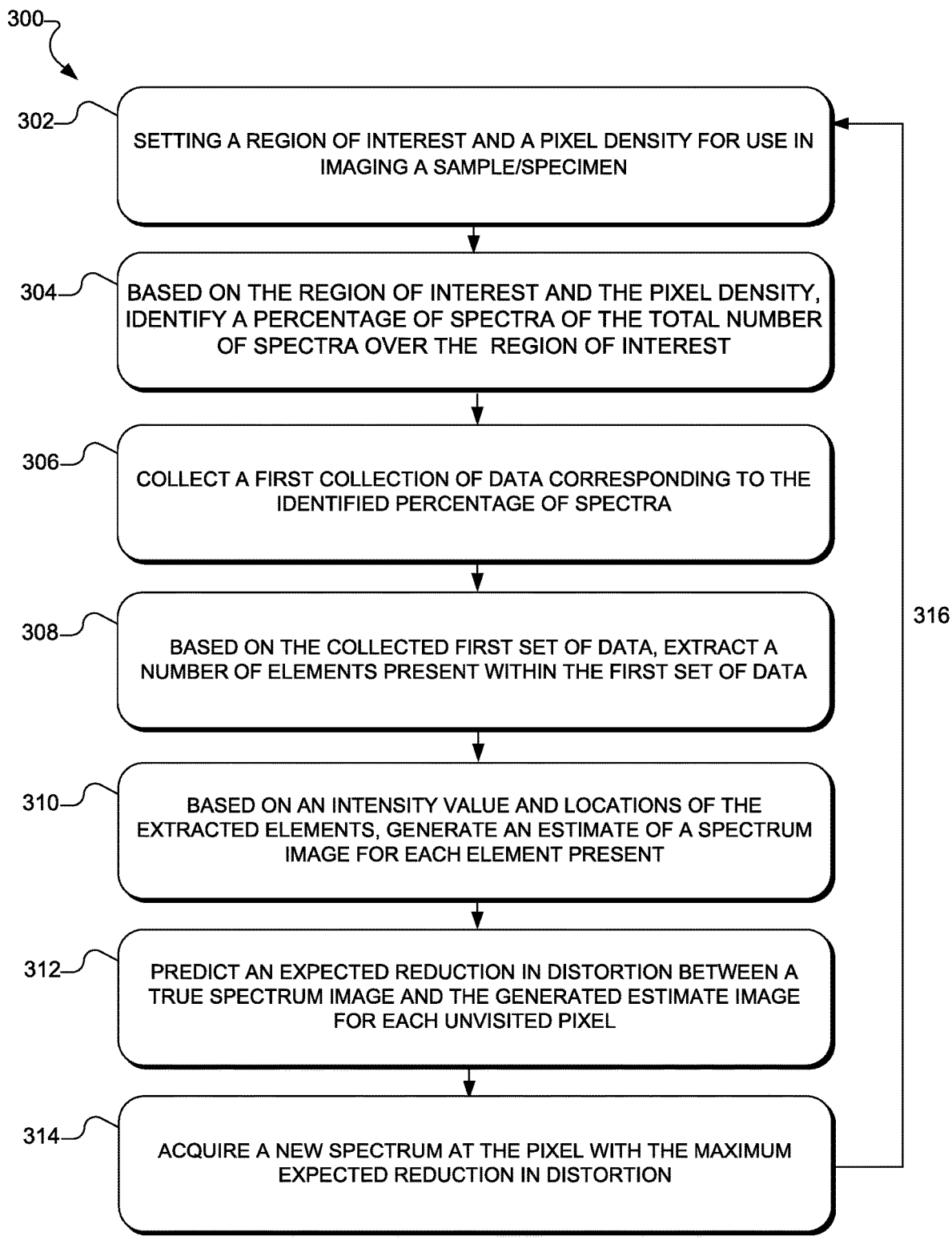
FIG. 3 is a flowchart illustrating an example process for reducing time and dosing during imaging, according to aspects of the present disclosure.

Referring now to FIG. 3 and with reference to FIGS. 1-2, an illustrative process 300 for reducing the time and dosing required to perform mapping, such as spectrum mapping is provided. As illustrated, process 300 begins with establishing or setting a region of interest (ROI) and a pixel density for use in imaging a sample/specimen (operation 302). For example, for an image (or an image to be captured) of a sample or specimen, a ROI, which represents a subpart of an image that contains important data/information, is identified. Additionally, pixel density, which represents the pixels per inch (PPI) or pixels per centimeter (PPCM) are measurements of pixel density (resolution) of an image, or image digitizing device, such as a STEM. Based on the ROI and the pixel density (e.g., grid of pixels) a percentage (e.g., one percent) of the total number of spectra are identified (e.g., uniformly or randomly) or otherwise identified over the ROI (operation 304).

A first, initial, collection or set of data is identified for the first percentage of spectra (operation 306). In one specific example and with reference to FIG. 1, the computing device 106 may transmit an instruction to the STEM to collect the data. Based on the collected first set of data, a number of elements are extracted that are present within the first set of data and their relative intensity value is determined (operation 308). In one specific example, three-window and peak fitting methods and/or algorithms may be employed to extract a number of elements, present within the first set of data, and their relative intensity value (either discrete values signifying presence/absence or a continuous quantified count value).

Based on the intensity values and locations of the extracted elements, an estimate (e.g., a crude estimate) of a spectrum image for each present element is generated (operation 310). In one specific example, the crude estimate of the spectrum image for each present element may be generated using impainting and features may be extracted from the following crude maps: gradients, variances in local intensity, and distance to previous measurements.

Using a vector of coefficients, the system predicts an Expected Reduction in Distortion (ERD) between the ground truth spectrum image (true image collected from direct observation, i.e., empirical evidence) and the generated crude estimate for each unvisited pixel, using for example, linear regression (operation 312). The system then automatically directs the STEM to acquire a new spectrum at the pixel with the maximum joint ERD for all signals of interest, choosing the best pixel from the Pareto front of optimal solutions. Based on the new spectrum data, the estimates of the sample are updated (operation 314).

The process 300 may be executed continuously (illustrated at 316). Stated differently, the process continues until a preset time or area dose threshold is exceeded, or when the estimated spectrum image remains the same on sampling additional points. Thus, each step of the process 300 proceeds as described above, except that for h different objectives an estimated map, feature vector, and ERD is constructed for every un-sampled point h times. Thus, the contribution of each un-sampled point to the contrast in each h map is estimated separately for a common set of sampled and un-sampled points. This allows for the use of different training images (and coefficient vectors) for different elements or mapping objectives, allowing one to map signals with very different features or distributions efficiently and simultaneously. When choosing the next point to sample, the system may sum the individual contributions of each candidate point to each h map. Thus, the point with the maximum joint ERD is sampled. Performing calculations in such a manner allows for the efficient and simultaneous mapping of multiple maps, where dose is apportioned to resolve relatively complicated maps, while minimizing time spent resolving simple one.

EXAMPLES

The disclosed technology is next described by means of the following examples. The use of these and other examples anywhere in the specification is illustrative only, and in no way limits the scope and meaning of the invention or of any exemplified form. Likewise, the invention is not limited to any particular preferred embodiments described herein. Indeed, modifications and variations of the invention may be apparent to those skilled in the art upon reading this specification, and can be made without departing from its spirit and scope. The invention is therefore to be limited only by the terms of the appended claims, along with the full scope of equivalents to which the claims are entitled.

Example 1

Data Results

An experiment was conducted using a fully sampled spectrum image of molybdenum disulfide flakes supporting a collection of magnetic iron oxide nanoparticles. These materials have been explored due to the multifunctional nature of combining super-para-magnetic nanoparticles with much of the unique electronic and optical properties of 2D $MoS_2$. The fully sampled spectrum image was kept in memory and the MOADS algorithm sequentially observed spectra from the grid of available measurements.

Figure 4:
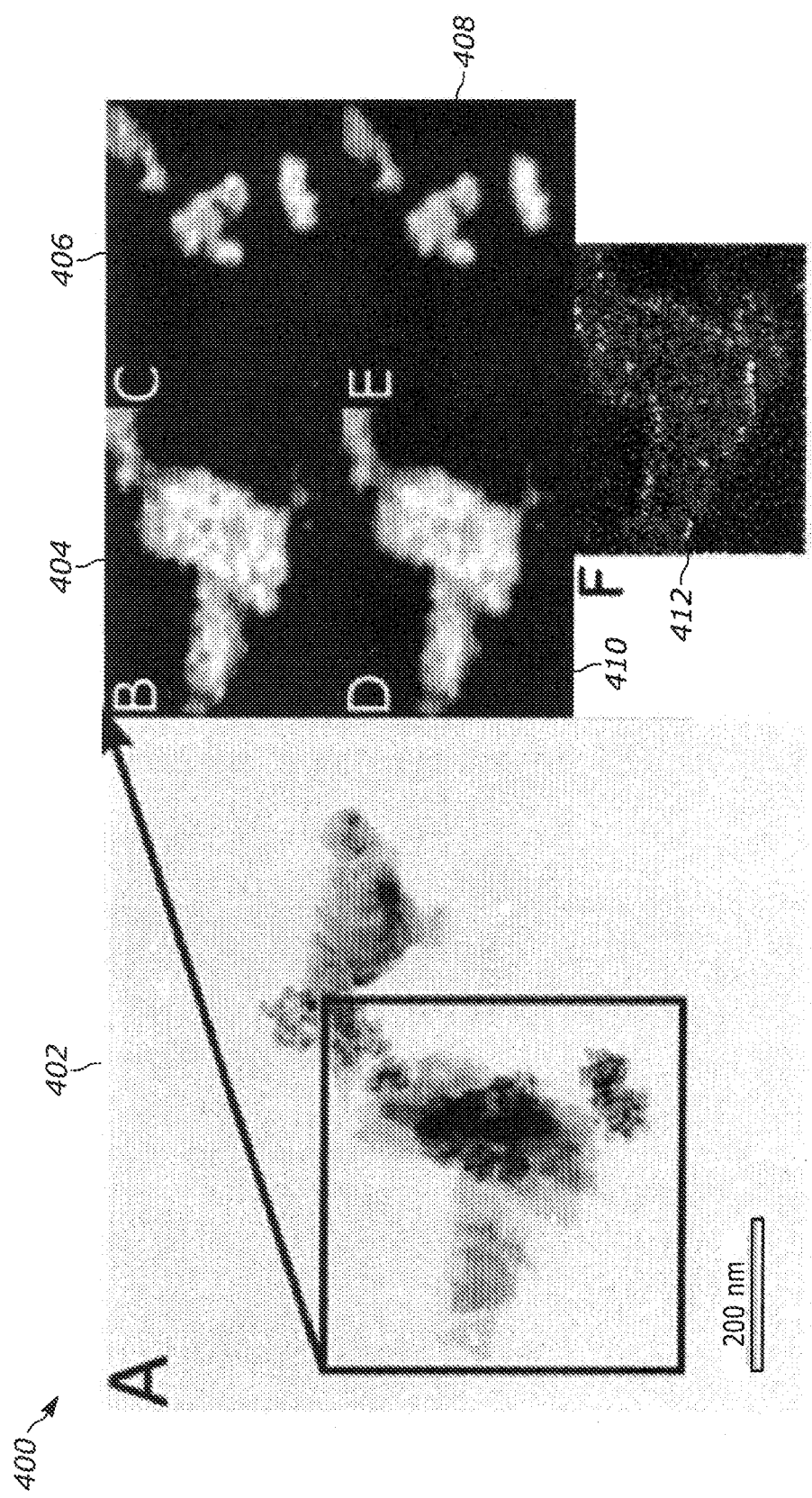
FIG. 4 provides an illustration of collected images captured by the disclosed system, according to aspects of the present disclosure.

The results of the simulated experiment can be seen in FIG. 4. Illustrated at 402 (A), is a Bright field STEM image showing the darker regions with high amounts of iron oxide particles supported by thin $MoS_2$ flakes. The inset shows the region collected using spectrum imaging. 404 (B) illustrates processed molybdenum $K_\alpha$ spectrum map showing strong agreement with the distribution of the flakes in the inset of A (132,156 pixels). 406(C) illustrates additional processed spectrum map of iron $K_\alpha$. 408(D) shows the final reconstructed molybdenum spectrum map after 12% of the pixels are collected. 410(E) provides a simultaneously collected MOADS reconstructed image of the iron spectrum map. 412(F) illustrates the map of measured spectra during the MOADS experiment to reconstruct both D, and E, the molybdenum and iron spectrum map, respectively. The set of coordinates is jointly optimized to record the minimal number of spectra to reconstruct both maps simultaneously.

Thus FIG. 4 illustrates the experimentally collected images and the spectrum images yielded by MOADS after simulation. Strong agreement, especially in the outline of the distribution of the molybdenum and iron signals, can be seen between the conventional fully sampled top panel set (ground truth) and the MOADS results (bottom panel set). Both the Iron and Molybdenum maps were simultaneously optimized given available measurements by MOADS for an order of magnitude less acquisition time/area dose.

Having demonstrated the potential benefit of MOADS, an experimental spectrum mapping of Boron Nitride flakes on lacey carbon was conducted, which is a classic specimen for the validation and calibration of EELS systems and spectrometers. These thin flakes provide well resolvable Boron and Nitrogen edges and are stable under the high exposures common to EELS measurements. Both the carbon support and the BN flakes provide highly distinguishable interfaces, in which the effectiveness of the dynamic sampling approach for autonomous EELS collection, and the balancing of multiple experimental objectives. As in this system, and in many other relevant materials, elements may have highly overlapping or uneven distributions. A simple approach to classify each region separately will fail to resolve overlapping interfaces in transmission electron imaging. Thus, it is essential to be able to balance multiple objectives when performing an adaptive or dynamic spectrum imaging technique.

Figure 5:
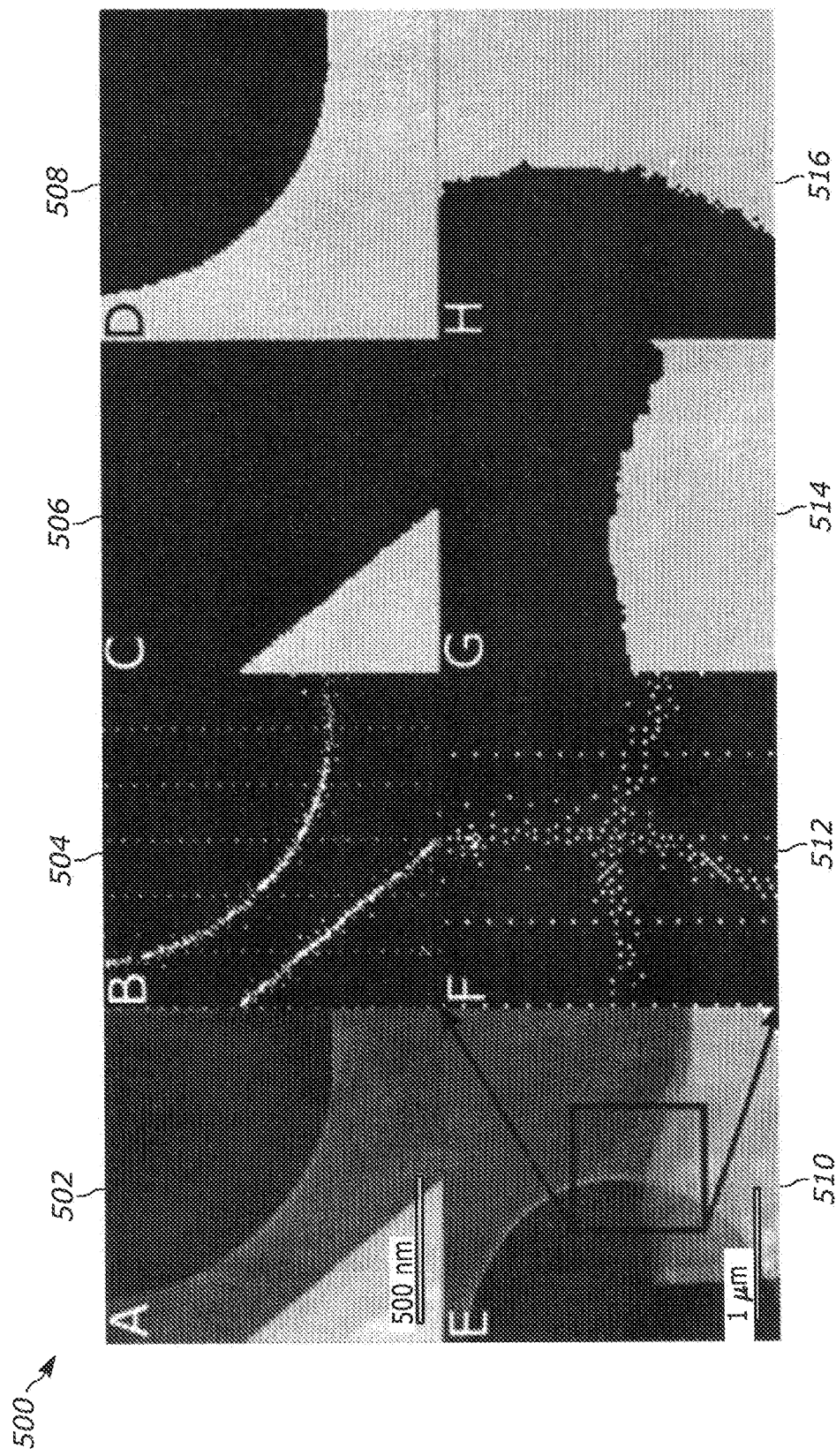
FIG. 5 provides an illustration of a series of images and corresponding data captured by the disclosed system, according to aspects of the present disclosure.

FIG. 5 illustrates a MOADS image 500 of Boron Nitride flakes on a lacey carbon film using Electron Energy Loss Spectroscopy. At 502 (A), a HAADF image of a Boron Nitride flake supported by carbon film, adjacent to vacuum on Hitachi HD2300 STEM with Gatan Enfina Spectrometer (convergence angle: 8 mrad, collection angle: 21 mrad) is provided. At 504 (B), the final mask of points imaged autonomously by the microscope, white pixels representing sampled and black skipped. 4% of the total pixels of the 120×120 spectrum image were collected in 9.6 minutes compared to 4 hours for a full spectrum image, with an initial 1% sampled uniformly. At each pixel a separate boron and carbon spectra were captured, each with an exposure of 0.5 seconds and a dispersion of 0.1 ev/ch. At 506 (C), a Reconstructed Boron map from the measured spectra in B of the area in A is provided. At 508 (D), a Reconstructed Carbon map of the area in A from spectra in B is provided. At 510 (E), an additional area of Boron Nitride flake in which the boron signal overlaps with the carbon and the vacuum is provided. At 512 (F), a sampled spectra from the inset in E, 5% of an 80×80 grid of spectra were collected in a total time of 7.5 minutes vs. 2.3 hours for a full spectrum image is provided. At 514 (G), a Reconstructed Boron map from the sampled spectra in F, and At 516 (H), a reconstructed Carbon map from the sampled spectra in F is provided. At 518 (I). Example of Boron EELS K edge, Carbon EELS K edge, and Nitrogen EELS K edge.

Thus, illustrated in FIG. 4, several regions with a distinguishable edge between the Carbon film, BN flake, and the vacuum were examined. More specifically, two distinct MOADS resolved spectrum images were collected using the Hitachi 2300 STEM equipped with a Gatan dedicated Enfina EELS spectrometer. The microscope is aligned and brought the desired region into field of view and focus, but the mapping was performed fully autonomously. In this case, one percent of the total number of pixels was sampled uniformly to make an initial guess about the sample structure. This initial sampling scheme can also be performed randomly or potentially initialized from the gradient of the HAADF image (so-called Z-contrast). In the illustrated embodiment, a uniform sampling scheme was selected, as it is reproducible and provides little initial sampling bias, giving no extra information about the curved or diagonal interfaces in the true specimen spectrum map.

Despite this, as seen in the left most panels of FIG. 4, the true interfaces are well captured at very small sampling percentages; even just 4% of the pixels in the top map is enough to quickly resolve the angled BN flake edge and the sloped interface between the Carbon and vacuum. In addition, where interfaces may overlap, as is the case in the middle inset of FIG. 4, the multi-objective formulation is able to apportion time and dose efficiently to distinguish the two overlapping interfaces independently from a shared set of pixel coordinates.

In both experiments, identical training images were used, simple straight lines separating areas of one element from another (binary images separated by sharp interfaces). The exact images used can be seen in the supporting information, but no explicit information about curved or wavy interfaces was given to estimate the coefficients, $\theta^h$. Despite this, the algorithm was still able to quickly distinguish between the lacey carbon and the vacuum within the spectrum images at very low sampling rates. When estimating $ERD_{BN}$ and $ERD_C$ the same coefficients were used, although this is not necessary, and it is entirely possible to train a second set of coefficients to deal with curved interfaces. However, as seen in FIG. 4 the algorithm is adept in handling shapes and distribution not seen during training, since the features used to predict the ERD are calculated on a pixel-by-pixel basis, and make no assumptions about larger order shapes or structures in the map. In all experiments reported in this paper, similar 'weakly informative' training images have been used to demonstrate the usability of the method.

In addition to dramatically reducing the time to produce a spectrum image, the system's dynamic approach can also substantially reduce the overall area dose. Below, a biologically relevant sample is produced, for which spectrum imaging is challenging to perform using a single EDS detector due to poor efficiency and long dwell times, which can quickly accumulate into a destructive area dose. Gallionella bacteria are unique organisms that have developed a metabolism utilizing oxidation of iron. These bacteria form biofilms in iron-rich environments such as freshwater springs, oceanic hydrothermal vents, or deep within the Earth's crust along redox gradients. They are also of interest in the astrobiology community, where such bacteria are a focus in the study of possible extraterrestrial life, particularly where harsh conditions and iron abundant environment coincide (asteroids, rocky planetoids, Mars, etc.).

Figure 6A:
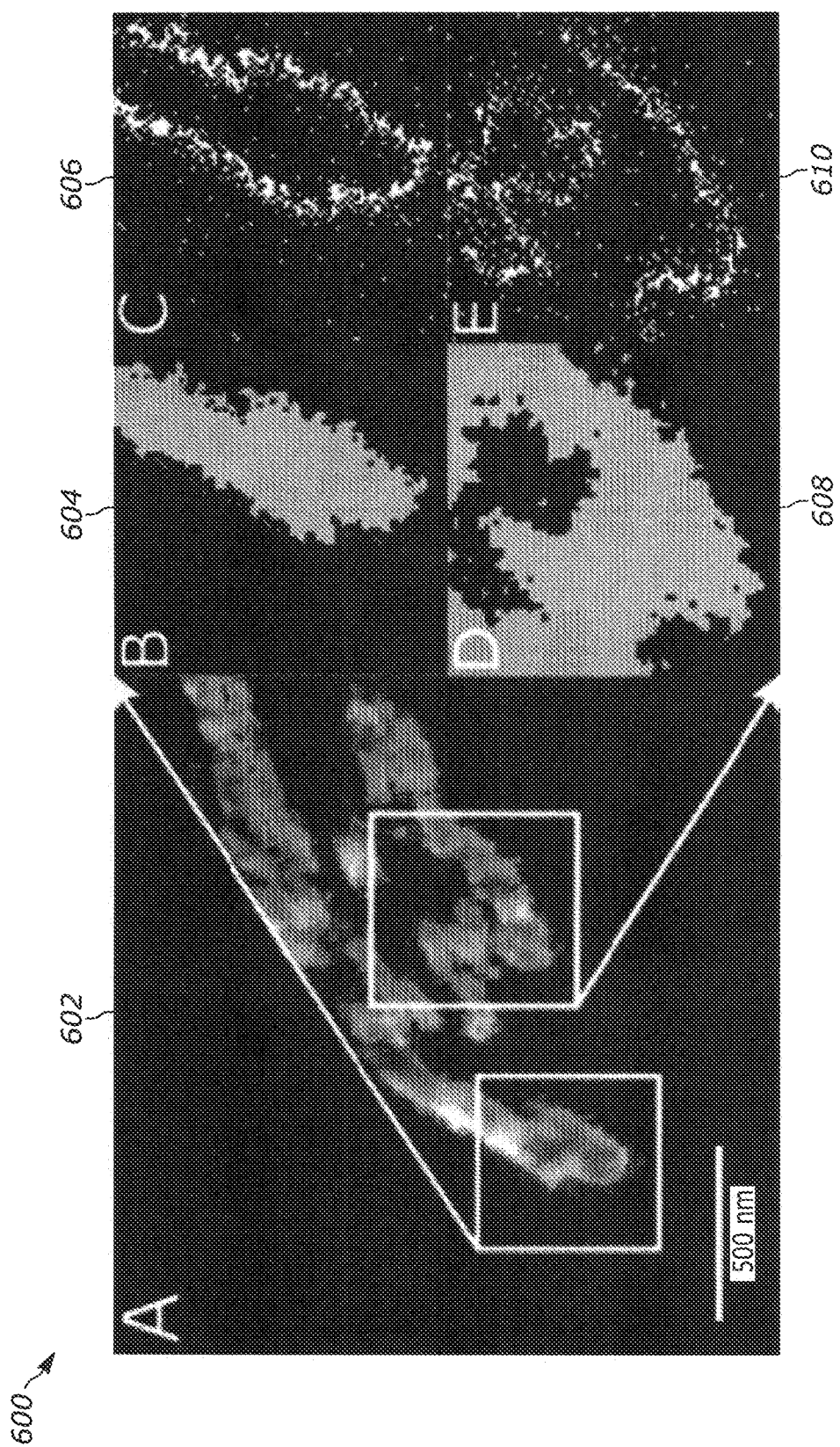
FIG. 6A provides an illustration of another series of images according to aspects of the present disclosure.
Figure 6B:
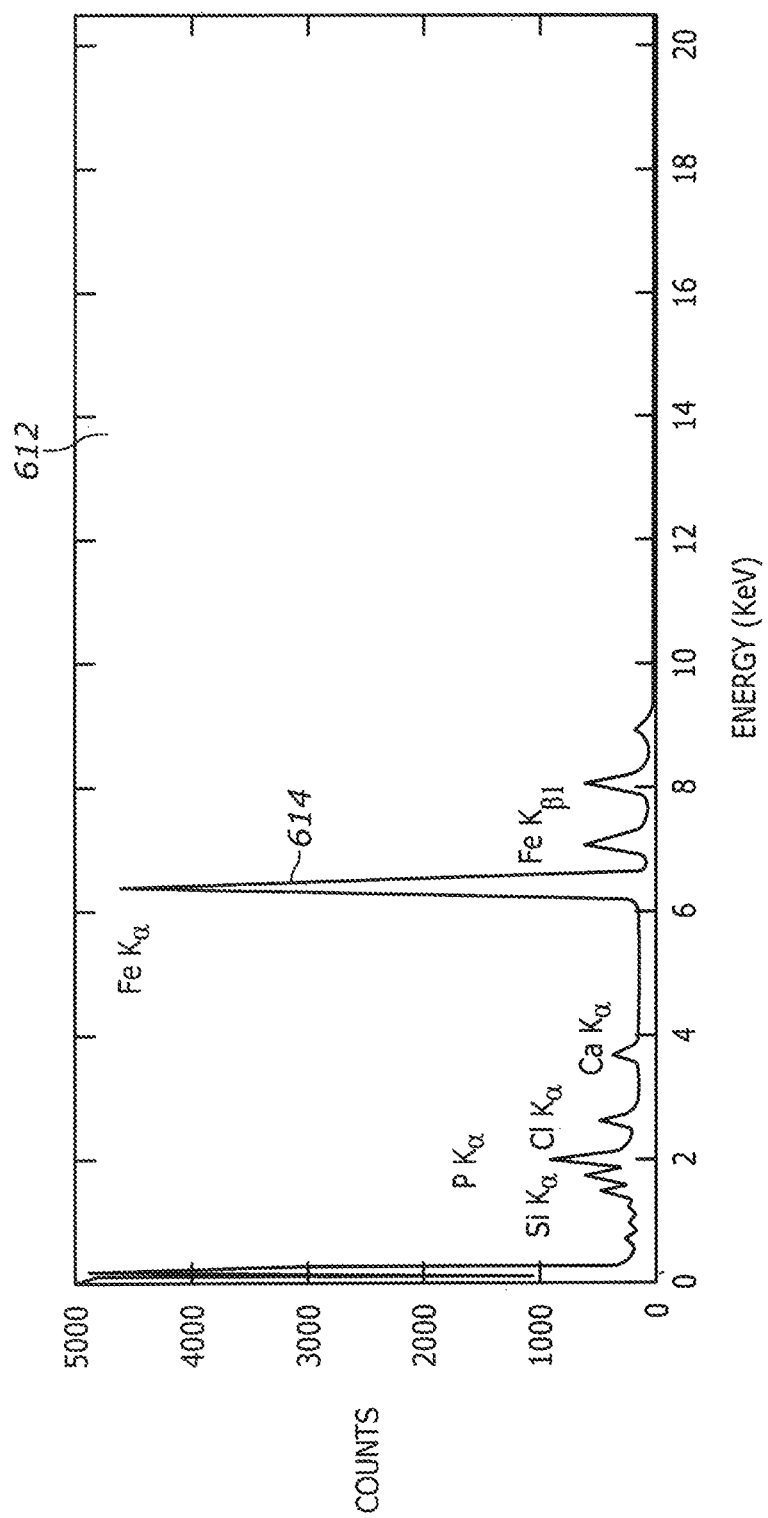
FIG. 6B provides a graph of data captured by the disclosed system, corresponding to the series of images of FIG. 6A.

FIG. 6A-6B illustrates autonomously collected dynamic EDS spectrum images (600) of Gallionella bacterial residue, resin embedded and sectioned to 20 nm. At 602 (A), a HAADF image collected on FEI Titan in STEM mode at 300 kV with a 150 µm C2 aperture, spot-size 6, and 10 µs dwell time is provided. At 604 (B), a scanning mask sampled by the microscope tracking the Fe $K_\alpha$ peak as feedback from a Gatan controlled EDAX EDS (channel width 10 eV) detector of the region in the bottom inset in image A is provided. 10% of the pixels in the 80×80 image were collected with a one second dwell time per pixel, resulting in a total collection time of 11.8 minutes vs. a conventional full SI acquisition of 2.7 hours. An initial 1% of the pixels was collected randomly. At 606 (C), a reconstructed image of the elemental distribution of iron from the scan mask in B is provided. At 608 (D), a Scanning mask collected from the rightmost inset in image A, again tracking the Fe $K_\alpha$ with an 80×80 grid and 10% sampling is provided. At 510 (E), a reconstructed image from the mask sampled in D is provided. FIG. 6B illustrates, at 612, a graph illustrating representative spectra collected with a 30 second dwell time showing the strong Fe $K_\alpha$ peak that was used for the mapping (2048 channels at 10 eV width).

Thus, as illustrated in FIG. 6, an autonomous dynamic spectrum mapping of a thin section of the spindle-like residue these bacteria leave behind post metabolism was conducted. Traditional HAADF images of these mixed carbon and iron spindles are shown in FIG. 5, where a dense core of iron is surrounded by a more sparsely packed distribution of iron oxide nanoparticles. Sampling was performed as described above, where pixels of maximum utility were iteratively selected based on the Fe $K_\alpha$ peak, and the microscope autonomously directed to record further EDS spectra at these areas. To demonstrate that the algorithm can autonomously perform spectrum imaging with a relative robustness to the shape of the initial sampling mask, we captured the first one percent of the spectra randomly with uniform probability.

As seen in FIG. 5, even at a low sampling percentage (10%) both spectrum maps of the insets of the HAADF image closely mirror the expected iron distribution in these materials. Strong agreement was reached with conventional fully sampled spectrum images, but at dramatically lower acquisition times and area doses (see supporting information for direct comparison with traditional fully sampled spectrum image). Notably, these EDS experiments were performed on a microscope with a single detector. Microscopes with additional and more efficient detectors can still enjoy an order of magnitude improvement of the total mapping time, while benefiting from a reduced individual measurement time.

As was the case for the Boron Nitride sample, 'weakly informative' training images were supplied to the algorithm before performing experimental imaging. These images are provided in the supporting information, where wavy lines separate areas of different contrast. No information about the ellipsoid cross section or spindle-like planar distribution of the residue was employed to accelerate imaging. In the case of extraordinarily dose sensitive materials or very high-fidelity spectrum images, several low dose HAADF images may be used as the training database to further reduce the necessary sampling percentages.

It is further possible to use the dynamic spectrum imaging framework to do high speed spectrum imaging of features other than pure elemental signatures in spectra. A titanium deficient region in a sample of Titanium-Aluminum, details of which can be found in previous publication, was determined using HAADF imaging and point-and-shoot EDS spectra. Utilizing the coefficients trained from the simple straight-line training database employed for the Boron Nitride flakes (see supporting information), spectrum imaging on a small inset of the HAADF image was performed.

Figure 7A:
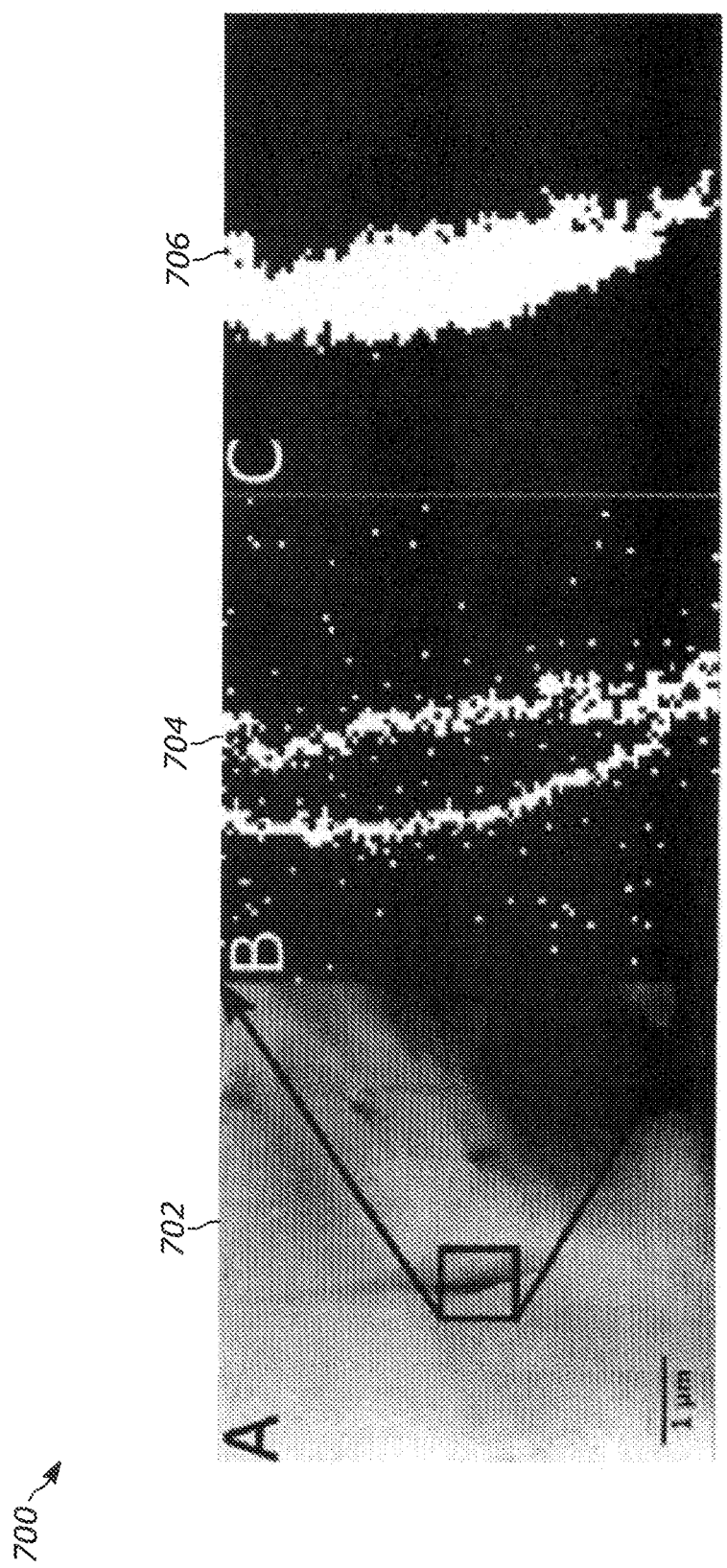
FIG. 7A provides an illustration of yet another series of images according to aspects of the present disclosure.
Figure 7B:
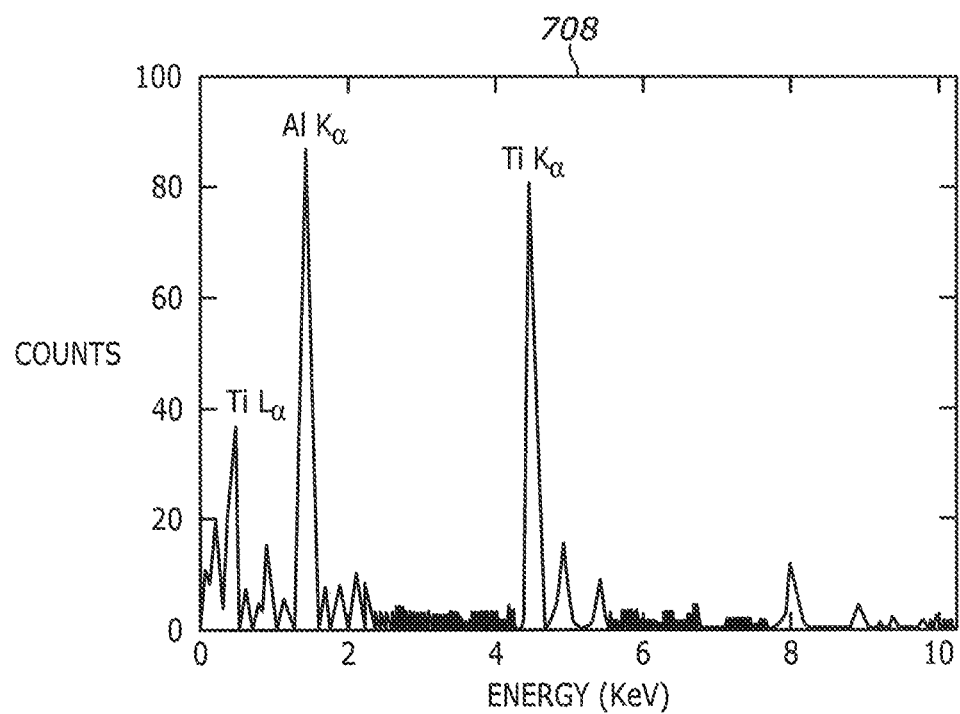
FIG. 7B provides a graph of data captured by the disclosed system, corresponding to the series of images of FIG. 7A.
Figure 7C:
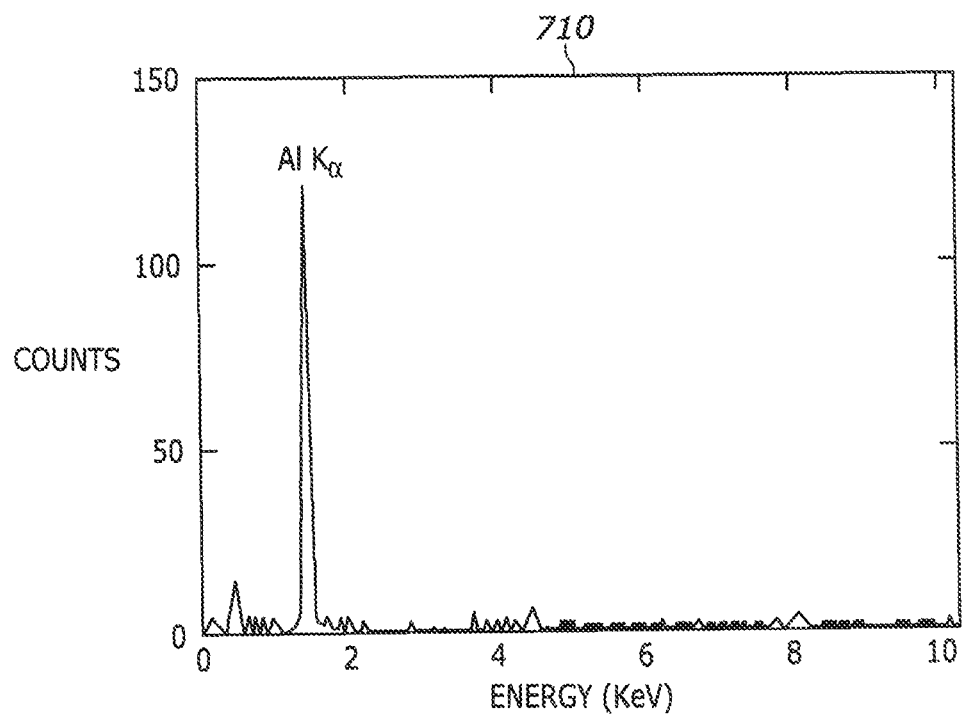
FIG. 7C provides another graph of data captured by the disclosed system, corresponding to the series of images of FIG. 7A.

FIGS. 7A-7C illustrate an example of Autonomous dynamic EDS mapping of a titanium deficient region in an annealed Ti 48 at. % Al alloy. At 702 (A), a HAADF image collected on an FEI Titan at 300 kV with 150 μm C2 aperture, spot-size 6 with 10 μs dwell time equipped with Gatan controlled EDAX EDS detector. At 704(B), the dynamic sampling algorithm was given the objective of mapping where the ratio of the counts between the Al $K_\alpha$ peak and the Ti $K_\alpha$ was greater than two (titanium deficient region). An initial 1% of the points were randomly sampled and the algorithm could autonomously control the microscope until 7% of the 80×80 grid of pixels in the spectrum image were collected. The learned mask of pixels from the inset in A is shown, closely tracking the darker feature in the inset of the HAADF image. A one second dwell time per spectra at a channel width of $10 ev$ was used during autonomous collection. At 606(C), the reconstructed image of the titanium deficient region, further tracking the dark feature in the inset of the HAADF image. FIG. 7B illustrates, at 708, a graph of representative EDS spectra collected from the light matrix in the image in A, showing strong signal from both the Al $K_\alpha$ peak and the Ti $K_\alpha$ peaks (dwell time 30 seconds). FIG. 7C illustrates, at 710, a graph representing a second spectra collected in the dark region of the inset in A showing the disappearance of the Titanium peak.

Accordingly, In FIG. 7, the dynamically sampled spectrum image of the titanium deficient region labeled in the left-most HAADF image is highlighted. Using this ratio between the Al $K_\alpha$ and Ti $K_\alpha$, the algorithm was quickly and autonomously able to distinguish the spatial distribution of this titanium deficient region using minimal prior information and mapping time. The use of the ratio between the Titanium and Aluminum peaks as the metric for mapping, rather than the pure Titanium count, allowed for the deconvolution of sample thickness and other mechanisms that might change the number of counts in any individual spectrum independent of the true spatial variation of Titanium within the sample. Other unique sample metrics may be chosen, such as the ratio of a plasmon peak to a core-loss edge in EELS, etc. in addition to producing independent maps. In addition, quantification methods for both EELS and EDS (normalizing by zero-loss or use of k-factors) can be performed on the fly during imaging.

Materials and Methods

Multi-Objective Dynamic Sampling Details.

The goal of dynamic sampling is to choose from a set of all possible measurements, a reduced set of points which cumulatively best approximate the true image. In one specific example, the measurements are made sequentially such that at each iteration, a pixel from the set of unmeasured pixels is chosen, which has the maximum expected reduction in distortion (ERD). At each iteration, a prediction is made and an observation of a set of continuous or pseudo-discrete values from the sample. For example, consider making k measurements at s locations with $X \in R^{n \times h}$ values.

$$S^{(k)} = \begin{bmatrix} s^{(1)}, X^{(1)}_{(1:h)} \\ \vdots \\ s^{(k)}, X^{(k)}_{(1:h)} \end{bmatrix}, \quad (0.1)$$

Where $s^{(k)}$ is an index location of a measurement where a vector containing the recorded EELS and or EDS spectra was integrated. For each measurement, the full EELS and EDS spectra is saved, which the algorithm on-the-fly identifies and fits the elemental peaks or edges in the spectra to store the raw or quantified counts or a discrete label for each h element in a vector $X^{(k)}_{(1:h)}$. Using $S^{(k)}$, a hyperspectral image $\hat{X}_h^{(k;s)}$ can be constructed, which approximates the true spectrum image X after sampling k measurements. This approximation is performed through simple nearest neighbor estimation but in principle any interpolation scheme can be used.

In one embodiment, the system chooses the set of measurement locations $s^{(k)}$ such that the cumulative pixel-by-pixel difference, or distortion $(D(X, \hat{X}^{(k;s)}))$, is minimized between the approximation $\hat{X}_h^{(k;s)}$ and the ground truth X for all h maps in the hyperspectral image. Each measurement contributes a reduction in distortion for each h map from the information contained in its spectra, so the system chooses the point which has the maximum joint reduction in distortion for all maps. In one specific example, the expected reduction in distortion (ERD: $R^{(k;s)}$) is used to evaluate which point should be measured next:

$$\tilde{R}^{(k;s)} = E[R^{(k;s)} | S^{(k)}] \quad (0.2)$$

The next measurement k+1 is chosen, which has the maximum joint ERD:

$$s^{(k+1)} = \underset{s \in \Omega}{\operatorname{argmax}} \left( \sum_h \tilde{R}_h^{(k;s)} \right) \quad (0.3)$$

In the supervised approach for dynamic sampling, the ERD values for all unmeasured pixels are predicted by mapping features from $\hat{X}^{(k;s)}$ to the ERD value for each un-sampled pixel linearly (see supporting information or previous publication for explicit features (28)):

$$\tilde{R} = f^\theta(V) \quad (0.4)$$

To learn the coefficients ($f^\theta$), a user provides a set of training images, which have similar features as the experimental images. Using the ground truth images, many values for R and V are populated and the coefficients, $\hat{\theta}$, are then estimated using simple linear regression:

$$\hat{\theta} = \arg\min \| \tilde{R} - V\theta \|^2 \quad (0.5)$$

Once the coefficients have been learned, the next measurement is chosen by taking the pixel with the maximum approximated ERD, from linearly multiplying the feature matrix times the coefficients:

$$s^{(k+1)} = \underset{s \in \Omega}{\operatorname{argmax}} \left( \sum_h V_h^n \hat{\theta}^h \right) \quad (0.6)$$

It becomes unnecessary to assign each spectrum, which may be composed of multiple elements, into one class. Thus, multiple elemental maps (for as many elements or signals as are present) may be constructed and imaged simultaneously.

Table S1. The features used to construct the V matrix. Each of these features is expanded polynomially into a 28 dimensional vector [1]. These features capture information about the structure of the image, such as gradients and local deviations, as well as the history of previous measurements, local density of measured points or distance to last measurement. These features have been shown previously to map un-measured pixels to the expected reduction in distortion (ERD) with high efficiency.

Microscope and Specimen Detail.

EELS experiments were performed on a Hitachi HD2300 dedicated STEM equipped with a Gatan Enfina EELS spectrometer. The microscope was operated at 200 kV with convergence angle range 5-24 mrad and collection angle range 7-30 mrad. EDS experiments were carried out on an FEI Titan TEM/STEM equipped with an image corrector and single EDAX Si(Li) detector in STEM mode at 300 kV, condenser aperture #2 200 mm, and probe size of 5 (probe current ~250 pA). In both cases, spectral acquisition was controlled through DM®. Flakes of $Fe_3O_4$—$MoS_2$ were drop casted onto a carbon membrane grid prior to imaging. The suspended Boron Nitride flakes on holey carbon film

TABLE 1

| $Z_1 = D(\hat{X}_{s_x+}, \hat{X}_{s_x-})$ Horizontal gradient in the reconstructed image for adjacent pixels around the potential measurement | $Z_2 = D(\hat{X}_{s_y+}, \hat{X}_{s_y-})$ Vertical gradient in the reconstructed image for adjacent pixels around the potential measurement |
|---|---|
| $Z_3 = \sqrt{\frac{1}{L}\sum_{r\in\delta s} D(X_r, \hat{X}_s)^2}$ The difference between the set of the closest L measurements and our estimate of the potential measurement | $Z_4 = \sum_{r\in\delta s} w_r^{(s)} D(X_r, \hat{X}_s)$ The difference between the closest measurements (r) and our potential measurement (s) weighted by the Euclidean distance |
| | $w_r^{(s)} = \dfrac{\dfrac{1}{\|s-r\|_2}}{\dfrac{1}{\sum_{u\in\delta s}\|s-u\|^2}}$ |
| $Z_5 = \min_{r\in\delta s}\|s-r\|_2$ The distance between the closest measurement and our potential measurement | $Z_6 = \dfrac{1+A_{(s;\lambda)}}{1+A^*_{(s;\lambda)}}$ The number of measurements performed in a disk of radius lambda around the potential measurement |

Table 1 illustrates the features used to construct the V matrix. Each of these features is expanded polynomially into, for example, a 28 dimensional vector. These features capture information about the structure of the image, such as gradients and local deviations, as well as the history of previous measurements, local density of measured points or distance to last measurement. These features have been shown previously to map un-measured pixels to the expected reduction in distortion (ERD) with high efficiency.

Computational Resources.

In some embodiments, a Digital Micrograph (DM®, Gatan Inc.) script/plugin was employed to interface MOADS with the microscope. Relative coordinates on a grid are sent over a network to the computer hosting DM®, which receives and converts the commands into DAC voltages for the scan coils on the microscope. Each spectrum is automatically collected and returned over the network to the support PC hosting the dynamic sampling code, which fits and analyzes the spectra. This process is iterated until a preset sampling threshold is met, the area dose limit for the materials is met, or the estimated spectrum map converges. As Digital Micrograph is relatively hardware agnostic and implemented on most analytical STEMs, the MOADS algorithm should be applicable to all type of scanning transmission electron microscopes: FEI, JEOL, and Hitachi.

was obtained from Gatan as a reference specimen for the testing and calibration of the Enfina EELS spectrometer. There is increasing interest in exploring the distribution of elements in soft-matter, particularly in the case where hard and soft material intersect, referred to as hybrid materials. In this vein, Gallionella spindles were chemically processed with aldehydes and osmium tetroxide followed by dehydration and infiltration with resin for ultramicrotomy. Binary Ti—Al films with nominal composition Ti-48 at. % Al were deposited using magnetron sputtering according to a previous published paper and annealed at 823 K for 10 minutes (29). Samples were mechanically grinded, dimpled, and ion milled to produce a thin foil for imaging.

Thus, as explained above, aspects of the present disclosure integrate a machine-learning algorithm (e.g., MOADS) with the acquisition process to actively sample only the pixels which maximally contribute to the information or the contrast in an image. The system involves and its practical implementation are composed of three primary, codependent, components: the microscope or serial measurement system, the control software which directly interfaces with the microscope, and the autonomous machine-learning software which directs the microscope to perform the optimal series of measurements.

The disclosed MOADS algorithm may be applied to virtually any STEM. MOADS achieves simultaneous and balanced mapping while adaptively minimizing the time and dost to capture a spectrum image with equivalent information, by eliminating redundant measurements. An order of magnitude less time to capture spectrum images means a potentially order of magnitude larger field of view, enabling dramatically higher throughput analytical characterization.

Figure 8:
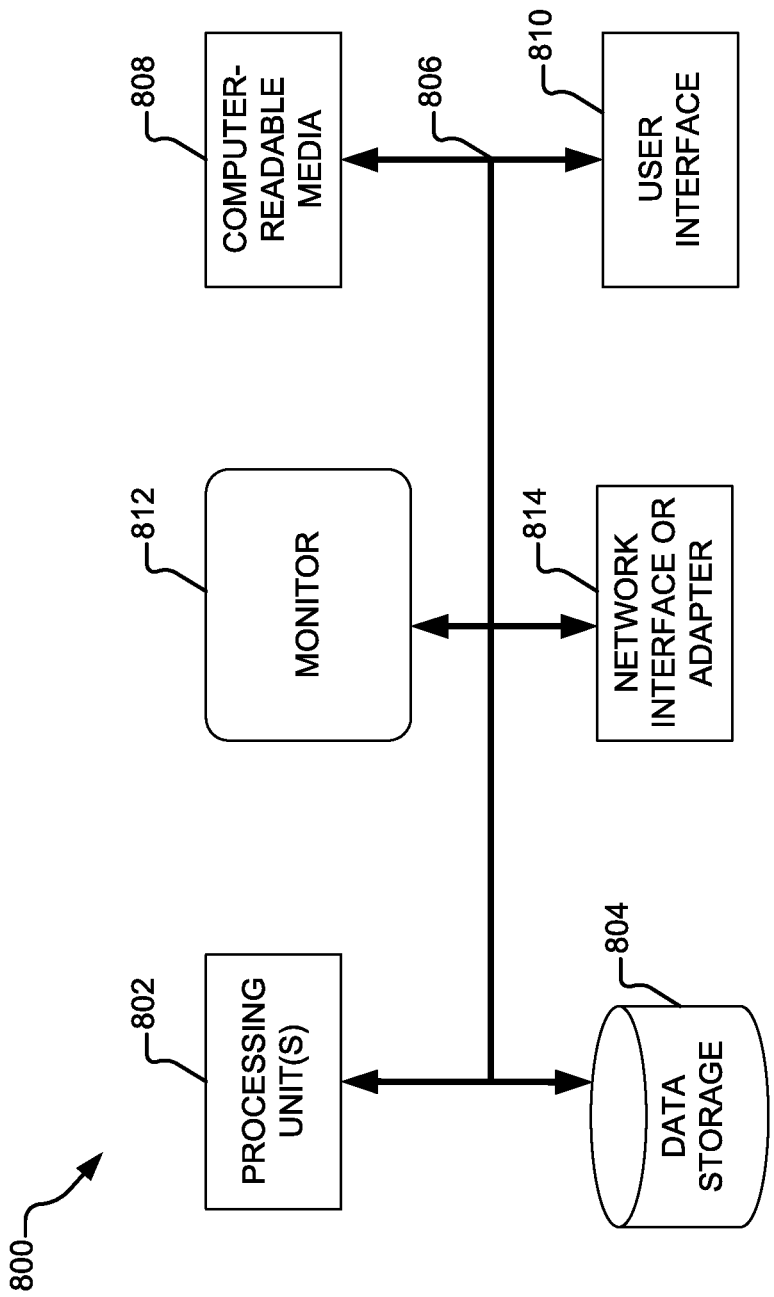
FIG. 8 is a block diagram illustrating a computing device specifically implemented for reconstructing images generated from information sampled in intentionally undersampled forms, according to aspects of the present disclosure.

FIG. 8 illustrates an example of a suitable computing and networking environment 800 that may be used to implement various aspects of the present disclosure described in FIG. 1-3 and particularly the computing system 808. As illustrated, the computing and networking environment 800 includes a general purpose computing device 800, although it is contemplated that the networking environment 800 may include one or more other computing systems, such as personal computers, server computers, hand-held or laptop devices, tablet devices, multiprocessor systems, microprocessor-based systems, set top boxes, programmable consumer electronic devices, network PCs, minicomputers, mainframe computers, digital signal processors, state machines, logic circuitries, distributed computing environments that include any of the above computing systems or devices, and the like.

Components of the computer 800 may include various hardware components, such as a processing unit 802, a data storage 804 (e.g., a system memory), and a system bus 806 that couples various system components of the computer 800 to the processing unit 802. The system bus 806 may be any of several types of bus structures including a memory bus or memory controller, a peripheral bus, and a local bus using any of a variety of bus architectures. For example, such architectures may include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus also known as Mezzanine bus.

The computer 800 may further include a variety of computer-readable media 808 that includes removable/non-removable media and volatile/nonvolatile media, but excludes transitory propagated signals. Computer-readable media 808 may also include computer storage media and communication media. Computer storage media includes removable/non-removable media and volatile/nonvolatile media implemented in any method or technology for storage of information, such as computer-readable instructions, data structures, program modules or other data, such as RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium that may be used to store the desired information/data and which may be accessed by the computer 800. Communication media includes computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. For example, communication media may include wired media such as a wired network or direct-wired connection and wireless media such as acoustic, RF, infrared, and/or other wireless media, or some combination thereof. Computer-readable media may be embodied as a computer program product, such as software stored on computer storage media.

The data storage or system memory 804 includes computer storage media in the form of volatile/nonvolatile memory such as read only memory (ROM) and random access memory (RAM). A basic input/output system (BIOS), containing the basic routines that help to transfer information between elements within the computer 800 (e.g., during start-up) is typically stored in ROM. RAM typically contains data and/or program modules that are immediately accessible to and/or presently being operated on by processing unit 802. For example, in one embodiment, data storage 804 holds an operating system, application programs, and other program modules and program data.

Data storage 804 may also include other removable/non-removable, volatile/nonvolatile computer storage media. For example, data storage 804 may be: a hard disk drive that reads from or writes to non-removable, nonvolatile magnetic media; a magnetic disk drive that reads from or writes to a removable, nonvolatile magnetic disk; and/or an optical disk drive that reads from or writes to a removable, nonvolatile optical disk such as a CD-ROM or other optical media. Other removable/non-removable, volatile/nonvolatile computer storage media may include magnetic tape cassettes, flash memory cards, digital versatile disks, digital video tape, solid state RAM, solid state ROM, and the like. The drives and their associated computer storage media, described above and illustrated in FIG. 8, provide storage of computer-readable instructions, data structures, program modules and other data for the computer 800.

A user may enter commands and information through a user interface 810 or other input devices such as a tablet, electronic digitizer, a microphone, keyboard, and/or pointing device, commonly referred to as mouse, trackball or touch pad. Other input devices may include a joystick, game pad, satellite dish, scanner, or the like. Additionally, voice inputs, gesture inputs (e.g., via hands or fingers), or other natural user interfaces may also be used with the appropriate input devices, such as a microphone, camera, tablet, touch pad, glove, or other sensor. These and other input devices are often connected to the processing unit 802 through a user interface 810 that is coupled to the system bus 806, but may be connected by other interface and bus structures, such as a parallel port, game port or a universal serial bus (USB). A monitor 812 or other type of display device is also connected to the system bus 806 via an interface, such as a video interface. The monitor 812 may also be integrated with a touch-screen panel or the like.

The computer 800 may operate in a networked or cloud-computing environment using logical connections of a network interface or adapter 814 to one or more remote devices, such as a remote computer. The remote computer may be a personal computer, a server, a router, a network PC, a peer device or other common network node, and typically includes many or all of the elements described above relative to the computer 800. The logical connections depicted in FIG. 8 include one or more local area networks (LAN) and one or more wide area networks (WAN), but may also include other networks. Such networking environments are commonplace in offices, enterprise-wide computer networks, intranets and the Internet.

When used in a networked or cloud-computing environment, the computer 800 may be connected to a public and/or private network through the network interface or adapter 814. In such embodiments, a modem or other means for establishing communications over the network is connected to the system bus 806 via the network interface or adapter 814 or other appropriate mechanism. A wireless networking component including an interface and antenna may be coupled through a suitable device such as an access point or peer computer to a network. In a networked environment, program modules depicted relative to the computer 800, or portions thereof, may be stored in the remote memory storage device.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements and methods which, although not explicitly shown or described herein, embody the principles of the disclosure and are thus within the spirit and scope of the present disclosure. From the above description and drawings, it will be understood by those of ordinary skill in the art that the particular embodiments shown and described are for purposes of illustrations only and are not intended to limit the scope of the present disclosure. References to details of particular embodiments are not intended to limit the scope of the disclosure.

What is claimed is:

1. A method for reducing time and dosing used to perform image mapping, comprising:
    causing, using a computing device, a measurement system to perform an initial spectral sampling of a sample specimen;
    identifying, using the computing device, a subset of spectra data from the sampling, the spectra data corresponding to respective pixels of a plurality of pixels measured during the initial spectral sampling;
    based on the subset of spectra data, generating, using the computing device, a first spectral image estimating a true spectrum image of the sample specimen;
    predicting, using the computing device, an expected reduction in distortion (ERO) between the first spectral image and the true spectrum image for one or more unmeasured pixels of the plurality of pixels;
    identifying, using the computing device, a pixel from the one or more unmeasured pixels, the pixel having a maximum ERO between the first spectral image and the true spectrum image; and
    based on the maximum ERO of the pixel, generating, using the computing device, a second spectral image estimating the true spectrum image of the sample specimen.

2. The method of claim 1 further comprising:
    identifying, using the computing device, a pixel from the second spectral image, the pixel contributing a maximum ERO; and
    based on the maximum ERO of the pixel, generating, using the computing device, a third spectral image estimating the true spectrum image of the sample specimen.

3. The method of claim 1, wherein the subset of spectra data includes a plurality of pixels, and wherein generating the estimate of the true spectrum image comprises:
    for each pixel of the plurality of pixels, estimating ERO between the true spectrum image and the first spectral image; and
    identifying the pixel having the maximum ERO.

4. The method of claim 1, wherein the measurement system is a scanning transmission electron microscope that emits a focused electron beam on the sample specimen to generate the spectral images.

5. The method of claim 1, wherein causing the measurement system to perform the initial spectral sampling of the sample specimen comprises identifying a region of interest and a pixel density.

6. The method of claim 1, wherein generating the first spectral image estimating the true spectrum image of the sample specimen comprises:
    extracting a number of elements present within the subset of spectra data;
    determining an intensity value for respective elements of the elements present within the spectra data; and
    generating the first spectral image in a series of spectral images based on the respective elements.

7. A non-transitory computer readable medium encoded with instructions for reducing time and dosing used to perform image mapping, the instructions, executable by a computing device, comprising:
    causing a measurement system to perform an initial spectral sampling of a sample specimen;
    identifying a subset of spectra data from the sampling, the spectra data corresponding to respective pixels of a plurality of pixels measured during the initial spectral sampling;
    based on the subset of spectra data, generating a first spectral image set estimating a true spectrum image series of the sample specimen;
    predicting an expected reduction in distortion (ERO) between the first spectral image set and the true spectrum image series for one or more unmeasured pixels of the plurality of pixels;
    identifying a pixel from the one or more unmeasured pixels, the identified pixel having a maximum ERO between the first spectral image set and the true spectrum image series for each signal individually; and
    based on a maximum joint ERO of the pixel from an arbitrary number of signals/elements, generating a second spectral image set estimating the true spectrum image series of the sample specimen.

8. The non-transitory computer readable medium of claim 7, further comprising:
    identifying a pixel from the second spectral image set, the pixel contributing a maximum ERO; and
    based on the maximum ERO of the pixel, generating a third spectral image set estimating the true spectrum image series of the sample specimen.

9. The non-transitory computer readable medium of claim 7, wherein the subset of spectra data includes a plurality of pixels, and wherein generating the estimate of the true spectral image set comprises:
    for each pixel of the plurality of pixels, estimating ERO between the true spectrum image series and the first spectral image set; and
    identifying the pixel having the maximum ERO.

10. The non-transitory computer readable medium of claim 7, wherein the measurement system is a scanning transmission electron microscope that emits a focused electron beam on the sample specimen to generate the spectral images.

11. The non-transitory computer readable medium of claim 7, wherein causing the measurement system to perform the initial spectral sampling of the sample specimen comprises identifying a region of interest and a pixel density.

12. The non-transitory computer readable medium of claim 7, wherein generating the first spectral image set estimating the true spectrum image series of the sample specimen comprises:
    extracting a number of elements present within the subset of spectra data;
    determining an intensity value for respective elements of the elements present within the spectra data; and generating the first spectral image set based on the respective elements.

13. A system for reducing time and dosing used to perform image mapping comprising:
   a computing device that includes a processor; and
   at least one computer-readable storage medium having stored therein instructions, which, when executed by the processor, cause the computing device to:
   cause a measurement system to perform an initial spectral sampling of a sample specimen;
   identify a subset of spectra data from the sampling, the spectra data corresponding to respective pixels of a plurality of pixels measured during the initial spectral sampling;
   based on the subset of spectra data, generate a first spectral image estimating a true spectrum image of the sample specimen;
   predict an expected reduction in distortion (ERO) between the first spectral image and the true spectrum image for one or more unmeasured pixels of the plurality of pixels;
   identify a pixel from the one or more unmeasured pixels, the identified pixel having a maximum ERO between the first spectral image and the true spectrum image; and
   based on the maximum ERO of the pixel, generate a second spectral image estimating the true spectrum image of the sample specimen.

14. The system of claim 13, wherein the processor further causes the computing device to:
   identify a pixel from the second spectral image, wherein the pixel contributes a maximum ERO; and
   based on the maximum ERO of the pixel, generate a third spectral image to estimate a true spectrum image of the sample specimen.

15. The system of claim 13, wherein the subset of spectra data includes a plurality of pixels, and wherein generation of the estimate of the true spectral image comprises:
   for each pixel of the plurality of pixels, estimation of ERO between the true spectrum image and the first spectral image; and
   identification of the pixel having the maximum ERO.

16. The system of claim 13, wherein the measurement system is a scanning transmission electron microscope that emits a focused electron beam on the sample specimen to generate the spectral images.

17. The system of claim 13, wherein to cause the measurement system to perform the initial spectral sampling of the sample specimen, the computing device identifies a region of interest and a pixel density.

18. The system of claim 13, wherein to generate the first spectral image estimating the true spectrum image of the sample specimen, the processor causes the computing device to:
   extract a number of elements present within the subset of spectra data;
   determine an intensity value for respective elements of the elements present within the spectra data; and
   generate the first spectral image based on the respective elements.

19. The system of claim 13, wherein the processor further causes the computing device to:
   determine whether a dosing threshold has been satisfied; and
   responsive to a determination that the dosing threshold has been satisfied, accept the second spectral image as the true spectrum image.

20. The system of claim 13, wherein the processor further causes the computing device to:
   determine whether a timing threshold has been satisfied; and
   responsive to a determination that the timing threshold has been satisfied, acceptin the second spectral image as the true spectrum image.

* * * * *